(12) United States Patent
Indoh

(10) Patent No.: US 6,903,590 B2
(45) Date of Patent: Jun. 7, 2005

(54) PULSE GENERATING CIRCUIT AND HIGH-SIDE DRIVER CIRCUIT

(75) Inventor: Shinobu Indoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 10/443,094

(22) Filed: May 22, 2003

(65) Prior Publication Data

US 2004/0212408 A1 Oct. 28, 2004

(30) Foreign Application Priority Data

Feb. 27, 2003 (JP) .......................................... 2003-051504

(51) Int. Cl.[7] .............................................. H03K 3/017
(52) U.S. Cl. ...................................... 327/172; 327/173
(58) Field of Search ................................ 327/171, 172, 327/173, 174, 182; 326/93, 95, 98, 112, 119, 121, 122

(56) References Cited

U.S. PATENT DOCUMENTS 6,369,615 B1 * 4/2002 Shimizu et al. ............... 326/93

6,525,580 B2 * 2/2003 Singor ........................ 327/172

FOREIGN PATENT DOCUMENTS

JP 2002-124858 4/2002

* cited by examiner

*Primary Examiner*—Linh My Nguyen
(74) *Attorney, Agent, or Firm*—Oblon, Spivak, McClelland, Maier & Neustadt, P.C.

(57) ABSTRACT

A pulse generating circuit that has a reset pulse generation circuit configured to output a reset pulse when an input signal changes from a first state to a second state and a set pulse generation circuit configured to output a set pulse when the input signal changes from the second state to the first state is provided. This reset/set pulse generation circuits each comprise a CMOS inverter and a delay unit. The delay unit includes a capacitor chargeable/dischargeable in response to an output signal of the CMOS inverter to output a delayed output signal. In the reset pulse generator circuit, its capacitor is connected between the CMOS inverter's output end and the power supply line. The set pulse generator circuit's capacitor is coupled between the CMOS inverter's output end and the ground line. The inverter circuit sets the output end at the power supply line before the state change of the input signal and sets this output end at the ground potential after the state change of the input signal.

19 Claims, 12 Drawing Sheets

Operation of Reset Pulse Generating
Circuit 14A' (When In Order)

Operation of Reset Pulse Generating
Circuit 14A' (When VCC Variation Occurs)

Operation of Set Pulse Generating
Circuit 14B (When In Order)

Operation of Set Pulse Generating
Circuit 14B (When VCC Variation Occurs)

Operation of Reset Pulse Generating
Circuit 14A" (When In Order)

Operation of Reset Pulse Generating
Circuit 14A" (When VCC Variation Occurs)

Operation of Set Pulse Generating
Circuit 14B' (When In Order)

Operation of Set Pulse Generating
Circuit 14B' (When VCC Variation Occurs)

(A) VCC
(B) Input (Negative Logic)
(C) POR Circuit's Output
(D) Input to Edge Pulse Generating Circuit
(E) Set Pulse
(F) Reset Pulse
(G) Output When in Order (Input"L→"H")

(A) VCC
(B) Input (Negative Logic)
(C) POR Circuit's Output
(D) Input to Edge Pulse Generating Circuit
(E) Set Pulse
(F) Reset Pulse
(G) Output When in Order (Input"H→"L")

(A) VCC (B) Input (Negative Logic)

(C) POR Circuit's Output (D) Input to Edge Pulse Generating Circuit (E) Set Pulse (F) Reset Pulse (G) Output When Vcc Variation Occurs (Input"L"→"H")

(A) VCC (B) Input (Negative Logic)

(C) POR Circuit's Output (D) Input to Edge Pulse Generating Circuit (E) Set Pulse (F) Reset Pulse (G) Output When Vcc Variation Occurs (Input"H"→"L")

Operation of Reset Pulse Generating Circuit 14A (When In Order)

Operation of Reset Pulse Generating Circuit 14A (When VCC Variation Occurs)

Operation of Set Pulse Generating
Circuit 14B (When In Order)

Operation of Set Pulse Generating
Circuit 14B (When VCC Variation Occurs)

PULSE GENERATING CIRCUIT AND HIGH-SIDE DRIVER CIRCUIT

CROSS-REFERENCE TO PRIOR APPLICATION

This application is based upon and claims the benefit of priority from the prior Japanese Patent Application No. 2003-51504, filed on Feb. 27, 2003, the entire contents of which are incorporated herein by reference.

BACKGROUND OF THE INVENTION

1. Field of the Invention

The present invention relates generally to pulse generation circuitry for output of reset and set pulses and, more particularly, to a pulse generating circuit adapted for use with a high-side driver circuit for driving a high-side power transistor of a power device with bridge-coupled power transistors. The invention also relates to a high-side driver circuit using the pulse generator circuit.

2. Description of the Related Art

An exemplary configuration of a semiconductor circuit 1 using a power device of the type stated above is shown in FIG. 7. The semiconductor circuit 1 shown herein is generally arranged to include a high-side driver 10 for driving a high-side power metal oxide semiconductor (MOS) transistor 30 and a low-side driver 20 for driving a low-side power MOS transistor 40. Note that the high-side power MOS transistor 30 and the low-side power MOS transistor 40 are half bridge-connected.

The high-side power MOS transistor 30 and low-side power MOS transistor 40 are driven by the highside driver 10 and lowside driver 20 so that these transistors are alternately rendered conductive, i.e. turn on, to thereby supply alternating electrical power to a load Ld.

The high-side power MOS power transistor 30 and lowside power MOS transistor 40 are cascade-coupled together between a high power supply voltage Vd and ground potential GND (low-side reference potential) through an intermediate terminal Pss. A voltage potential at this intermediate terminal Pss will be referred to as a high-side reference potential Vss hereinafter. The highside reference potential Vss swings or "vibrates" in a way responsive to a present switching state of lowside power MOS transistor 40. More specifically, in the event that lowside power MOS transistor 40 is rendered conductive (turn on) and highside power MOS transistor 30 is made nonconductive (turn off), the highside reference potential Vss becomes substantially equal to the ground potential GND. Alternatively when high-side power MOS transistor 30 is driven to turn on while lowside power MOS transistor 40 turns off, highside reference potential Vss is substantially the same as the power supply voltage Vd.

The high-side driver 10 is operable to output an output signal (switching signal) G to the gate of the highside power MOS transistor 30 to thereby permit switching between electrical conduction and non-conduction states of highside power MOS transistor 30.

Similarly the low-side driver 20 outputs an output signal to the gate of the lowside power MOS transistor 40 to thereby switch between electrical conduction and nonconduction of lowside power MOS transistor 40.

An explanation will next be given of a configuration of the high-side driver 10. This highside driver 10 is equipped with an input circuit 11, a power-on reset circuit (POR circuit) 12, a logic OR gate circuit 13, an edge pulse generation circuit 14, a level shift circuit 15, a reset/set pulse (RS) latch circuit 16, and an output circuit 17. The input circuit 11 and edge pulse generator circuit 14 are supplied with the power supply voltage Vcc based on the ground potential GND as its reference potential level.

The input circuit 11 is the one that receives an input signal B which changes in potential between "High" or "H" level and "Low" ("L") level at prespecified timings and then outputs this signal B. Here, suppose that the input signal B being input to the input circuit 11 is a negative logic signal. Thus, when the input signal potentially rises from "L" up to "H" level, the high-side power MOS transistor 30 is rendered nonconductive (that is, turns off); when the input signal falls from THE down to "L" level, highside power MOS transistor 30 is made conductive (i.e. turns on).

The POR circuit 12 is the one that detects potential rise-up of the power supply voltage Vcc and then outputs a power-on reset pulse signal C. In cases where power supply voltage Vcc is potentially stabilized and thus is set at a potential level higher than the threshold voltage, an output signal of the POR circuit 12 stays at "L" level. Only when supply voltage Vcc becomes less than the threshold voltage and thereafter recovers at its last potential level, the power-on reset pulse C is output from POR circuit 12. With such an arrangement, POR circuit 12 functions to monitor a present state of supply voltage Vcc. The logic OR gate circuit 13 is the one that logically processes the input signal B from input circuit 11 and the input signal (power-on reset pulse C) from POR circuit 12 to thereby derive an output signal D indicative of a logical sum of these input signals.

The edge pulse generator circuit 14 is operable in responding to receipt of this output signal D of the OR gate circuit 13 in a way which follows: upon potential rise-up of this output signal D, edge pulse generator 14 generates at its output a reset pulse signal F which is used to render the high-side power MOS transistor 30 nonconductive (i.e. turn on); upon potential fall-down of output signal D, it outputs a set pulse signal E for making highside power MOS transistor 30 conductive (i.e. turn on). The level shift circuit 15 is for receiving the reset pulse F and set pulse E as output from the edge pulse generator circuit 14 and for potentially shifting these pulses from potential levels based on the ground potential GND, to those based on the highside reference potential Vss.

The RS latch circuit 16 is the one that latches therein these level-shifted reset and set pulses. The output circuit 17 is operatively responsive to the latched reset or set pulse, for changing between "H" and "L" levels an output signal (switching signal) G being output to the gate of high-side power MOS transistor 30. Such level change of this output signal G causes highside power MOS transistor 30 to turn on and off. Additionally the RS latch 16 and output circuit 17 are driven by a highside power supply voltage VBS with the highside reference potential Vss as its reference.

Note that the low-side driver 20 is almost similar to the high-side driver 10 in arrangement other than the configuration of its level shift circuit 15.

Referring next to FIG. 8, there is shown a detailed configuration example of the edge pulse generator circuit 14 of FIG. 7. As shown herein, the edge pulse generator circuit 14 is generally constituted from a reset pulse generator circuit 14A, a set pulse generator circuit 14B, and an inverter circuit 15.

The reset pulse generator circuit 14A and set pulse generator circuit 14B are different from each other in that the former permits input of the output signal D of OR gate circuit 13 through the inverter circuit 51 whereas the latter allows direct input of the output signal D via no inverter circuit. These circuits 14A–14B are the same as each other in the remaining configuration.

The reset pulse generator circuit 14A is configured from a serial combination of inverters 52, 53, 54 and a NOR gate circuit 55. The inverter circuit 53 is made up of a complementary MOS (CMOS) inverter circuit which includes a P-channel MOS (PMOS) transistor MP1 and an N-channel MOS (NMOS) transistor MN1, and an RC delay circuit which comprises a resistor R1 and a capacitor C1 and which is connected to the output side of this CMOS inverter circuit. The RC delay circuit is operable to force an output signal to gradually vary in potential along the transient phenomenon curve that is determinable by an RC time constant of the delay circuit. The RC delay circuit also operates to switch the logical value of the output signal of inverter circuit 54 when it reaches the threshold voltage of inverter circuit 54 to thereby delay an input signal by a predetermined length of time. Note here that one prior known delay circuit of this type has been disclosed, for example, in Published Unexamined Japanese Patent Application No. 2002-124858.

The NOR circuit 55 is operable to output a signal indicative of the NOT-OR or "NOR" value U of an output signal T of inverter circuit 54 and an output signal Q of inverter circuit 51. The set pulse generator circuit 14B comprises a serial connection of inverter circuits 56 to 58 and a NOR gate circuit 59, which are similar in function to the inverter circuits 52–54 and NOR gate 55, respectively. The inverter 57 is configured from a CMOS inverter circuit which is formed of a PMOS transistor MP2 and an NMOS transistor MN2, and an RC delay circuit which has a resistor R2 and a capacitor C2 and which is connected to the output side of this CMOS inverter circuit. Note here that in FIG. 1, reference character "X" is used to designate an output signal of inverter 58, while "Y" denotes an output of NOR gate 59.

Referring next to FIGS. 9A and 9B, timing charts are presented each showing an operation of the circuitry of FIG. 7 when this circuit operates properly. FIG. 9A shows a timing chart in case the input signal B changes in potential from "L" to "H" level; FIG. 9B is a timing chart when input signal B changes from "H" to "L" adversely.

As shown in FIG. 9A, when the input signal B being given to the input circuit 11 changes from "L" to "H" level at time point t1, the reset pulse generator circuit 14A derives at its output a reset pulse F within a time period spanning from this time point t1 to time t2. This reset pulse F is transmitted by the level shift circuit 15 toward the high voltage side, for resetting the RS latch circuit 16 and for causing an output signal G of output circuit 17 to potentially change from "H" to "L" level.

Alternatively as shown in FIG. 9B, when the input signal B changes from "H" to "L" level at time point t3, the set pulse generator circuit 14B generates at its output a set pulse E within a time period of from this time point t3 to time point t4. This set pulse E is sent forth via the level shift circuit 15 to the high voltage side for setting RS latch circuit 16 and for causing the output signal G of output circuit 17 to change from "L" to "H" level.

In the semiconductor circuit 1 shown in FIG. 7, the set pulse E and reset pulse F are alternately output every time the input signal B changes in logic level, thereby controlling the high-side power MOS transistor 30 to turn on and off appropriately.

Unfortunately as shown in FIG. 10A, the power supply voltage Vcc can potentially vary or fluctuate in some cases. For example, upon potential switching or transition of the input signal B from "L" to "H" level, the supply voltage Vcc becomes at zero (0) volts simultaneously, due to the influence of externally incoming noises or the like. If this is the case, the reset pulse F (indicated by dotted lines in FIG. 10A) that is to be output from the reset pulse generator circuit 14A within a time period between time points t5 and t6 is no longer output. This would cause a problem that the output signal G from the output circuit 17 hardly changes from "H" to "L" level.

Adversely to the case of FIG. 10A, the power supply voltage Vcc can sometimes drop down at 0V due to the influence of external attendant noises or else simultaneously upon potential transition of the input signal B from "H" to "L" level as shown in FIG. 10B. In this case the reset pulse F is output within a time period between time points t7 and t8 (note however that this pulse production per se never affects the output signal G) while the set pulse E is output within a time period between times t8 and t9 in a similar way to that in the case shown in FIG. 9B (note that a delay must be found in the output timing thereof).

In this way, any failure to output the reset pulse F required makes it impossible to appropriately drive the high-side power MOS transistor 30 to switch from its electrical conductive (turn-on) state to nonconductive (turn-off) state. This in turn results in the high-side power MOS transistor 30 and low-side power MOS transistor 40 turning on simultaneously in a way depending upon the control state of the low-side driver 20. This raises a problem that a shortcircuiting or "shoot-through" current flows in both the transistors 30 and 40.

The reason why this reset pulse F is failed to be output will be explained with reference to the timing diagrams of FIGS. 11A–11B and FIGS. 12A–12B while also referring to the configurations of the reset pulse generator circuit 14A and set pulse generator circuit 14B of FIG. 8.

FIGS. 11A and 11B are timing charts each showing an operation of the reset pulse generator circuit 14A. FIG. 11A shows some main signals available while the circuit operates properly (that is, when the power supply voltage Vcc is potentially stabilized); FIG. 11B is when power supply voltage Vcc varies in potential.

As shown in FIG. 11A, in case the power supply voltage Vcc is stable in potential, the output signal D of OR gate circuit 13 potentially rises up at time point t1. Simultaneously the output signal Q of the inverter circuit 51—this is an inverted version of the signal D—rises up in potential. At this time the transistor MN1 of inverter circuit 53 is rendered conductive, whereas transistor MP1 thereof is made nonconductive. This causes electrical charge of the capacitor C1 to discharge and thus gradually decrease in amount along the time constant of RC delay circuit. After time t1, an output signal VCR of inverter 53 attempts to gradually come closer to the "L" level along the transition curve that is determinable by the time constant of RC delay circuit. At time t2, the output signal VCR becomes less than the threshold voltage level of inverter circuit 54, an output signal T of inverter 54 potentially changes from "L" to "H" level. Thus, a signal U with its level equal to the NOR value of these output signals T and Q is output from NOR circuit 55. This output signal U is for use as the reset pulse F.

However, when the power supply voltage Vcc varies in potential as shown in FIG. 11B, for example, when supply voltage Vcc becomes at 0V due to the influence of external noises or else (in this case, the output signal D does not rise up) at the same time that the input signal B rises up at time t1, the output signal VCR of inverter circuit 53 also changes in potential to rapidly reach "L" level undesirably and continues to stay at "L" even when supply voltage Vcc recovers to its original value at time t5. This occurs for the reason which follows. When supply voltage Vcc potentially drops down at 0V, a parasitic diode Di of the transistor MP1 of inverter 53 is made conductive in response thereto. Through this parasitic diode Di, the charge that is presently accumulated or stored at capacitor C1 is discharged instantly to thereby force the output signal VCR to be at "L" level instantly. Due to this, output signal VCR is kept at "L" even when supply voltage Vcc recovers to its original potential level at time t5 because of the absence of charge at capacitor C1.

Regarding the output signal T of inverter circuit 54, this signal potentially rises from "L" up to "H" level due to the potential recovery of the power supply voltage Vcc at time t3. This allows the output signal U of NOR gate 55 to stay at "L" so that the reset pulse F does not generate.

It should be noted that the set pulse generator circuit 14B is free from the risk of such failure to generate the set pulse E even upon occurrence of potential variation of the power supply voltage Vcc. FIG. 12A is a timing chart showing an operation of the set pulse generator circuit 14B during a proper operation thereof (while the supply voltage Vcc is stabilized in potential); FIG. 12B is a timing chart showing an operation of the set pulse generator circuit 14B in the event that supply voltage Vcc potentially varies. In the set pulse generator 14B, even upon potential variation of supply voltage Vcc, an output signal VCR' behaves to recover within a time period between time points t7–t8 owing to chargeup by a power-on reset pulse C of POR circuit 12. For the very reason, as shown in FIG. 12B, the intended set pulse E does generate even upon occurrence of power supply voltage variations or fluctuations, although slight delays take place in pulse generation timing (the t3–t4 period is shifted to t8–t9 period).

As apparent from the foregoing discussion, the prior art edge pulse generator circuit shown in FIG. 7 is such that its reset pulse generator circuit 14A is sometimes incapable of generating the required reset pulse F due to the instability of power supply voltage Vcc. As for the set pulse generator circuit 14B thereof, this circuit is expected to generate the set pulse even when supply voltage Vcc is somewhat unstable in potential. Due to this, depending on the control state of the low-side driver 20, both the high-side power MOS transistor 30 and the low-side power MOS transistor 40 can be accidentally rendered conductive at a time, resulting in unwanted flow of a shoot-through or penetration current in the both transistors 30 and 40. Disadvantageously this often affects the entire system so that it decreases in operation stability and reliability. In the worst case the transistors 30 and 40 can be destroyed.

The present invention has been made in view of the problems faced with the prior art, and an object of the invention is to provide a pulse generating circuit capable of ensuring reliable output of a reset pulse or pulses even upon potential variation of the power supply voltage to thereby enable preclusion of circuit operation failures and also to provide a high-side driver circuit using the same.

SUMMARY OF THE INVENTION

To attain the foregoing object, a pulse generating circuit in accordance with this invention has a reset pulse generation circuit configured to output a reset pulse based on changes of an input signal from a first state to a second state, and a set pulse generation circuit configured to output a set pulse based on changes of said input signal from said second state to said first state. Each of these reset pulse generation circuit and set pulse generation circuit comprises an inverter circuit which includes a pair of transistors as complementarily connected between a power supply line and a ground line, and a delay unit which includes a capacitor and outputs a delayed output signal with a delayed state change of the input signal. The reset pulse generation circuit is such that its capacitor is connected between an output end of the inverter circuit and the power supply line. The set pulse generation circuit is such that its capacitor is connected between the output end of the inverter circuit and the ground line. The inverter circuit in the reset pulse generation circuit is operable to output a signal at a level of the power supply line when said input signal is in the first state and to output a signal at a level of said ground line when said input signal is in the second state.

To attain the above object a high-side driver circuit incorporating the principles of the invention is adapted for use with a power device which has bridge circuitry of a high-side power transistor and a low-side power transistor, configured to drive the high-side power transistor of the power device. The high-side driver circuit comprises a pulse generating circuit which has a reset pulse generation circuit configured to output a reset pulse based on changes of an input signal from a first state to a second state and a set pulse generation circuit configured to output a set pulse based on changes of said input signal from said second state to said first state, a power-on reset circuit which outputs upon power recovery a power-on reset signal for use as an input signal of the pulse generating circuit, a level shift circuit shifting levels of the reset pulse and set pulse which are output from the pulse generation circuit, a latch circuit with an output state being reset and set by the level-shifted reset pulse and set pulse respectively, and an output circuit operatively responsive to an output of the latch circuit outputting a drive signal used to drive the high-side power transistor. Each of the reset pulse generation circuit and the set pulse generation circuit comprises an inverter circuit which includes a pair of transistors that are complementarily connected between a power supply line and a ground line, and a delay unit which includes a capacitor and which outputs a delayed output signal with a delayed state change of the input signal. The capacitor of the reset pulse generation circuit is connected between an output end of the inverter circuit and the power supply line. The inverter circuit of the reset pulse generation circuit is operable to output a signal at a level of the power supply line when the input signal is in the first state and to output a signal at a level of the ground line when the input signal is in the second state. The capacitor of the set pulse generation circuit is connected between the output end of the inverter circuit and the ground line. The inverter circuit of the set pulse generation circuit is operable to output a signal at the level of the power supply line when the input signal is in the second state and to output a signal at the level of the ground line when the input signal is in the first state. This inverter circuit sets the output end at the level of the power supply line during outputting of the power-on reset signal.

DETAILED DESCRIPTION OF THE EMBODIMENTS

Illustrative embodiments of the present invention will be explained with reference to the accompanying drawings below.

[First Embodiment]

Figure 1:
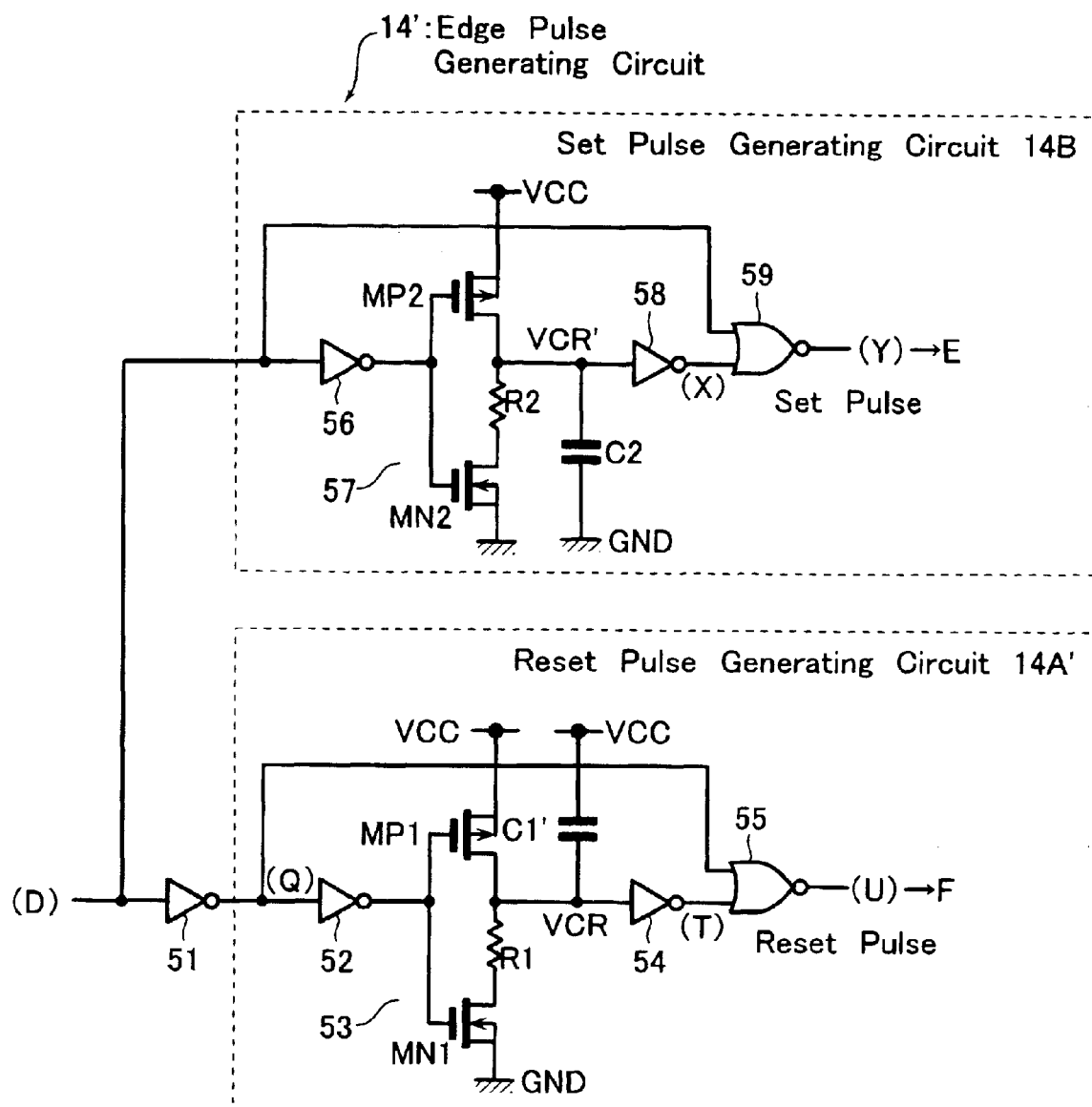
FIG. 1 is a circuit diagram showing a configuration of a semiconductor circuit in accordance with a first embodiment of the present invention.
Figure 8:
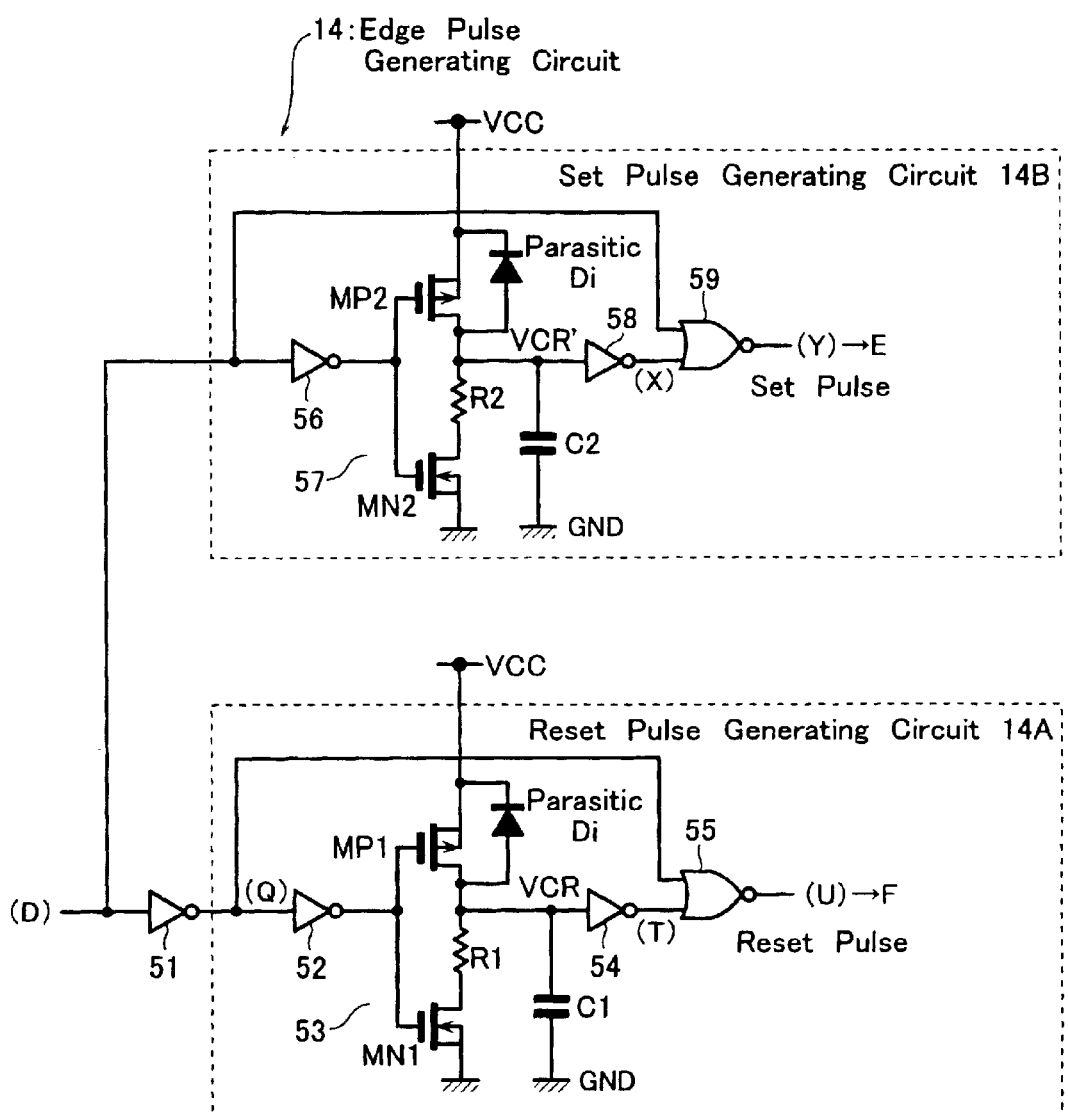
FIG. 8 shows a detailed configuration example of an edge pulse generation circuit 14 of FIG. 7.
Figure 9A:
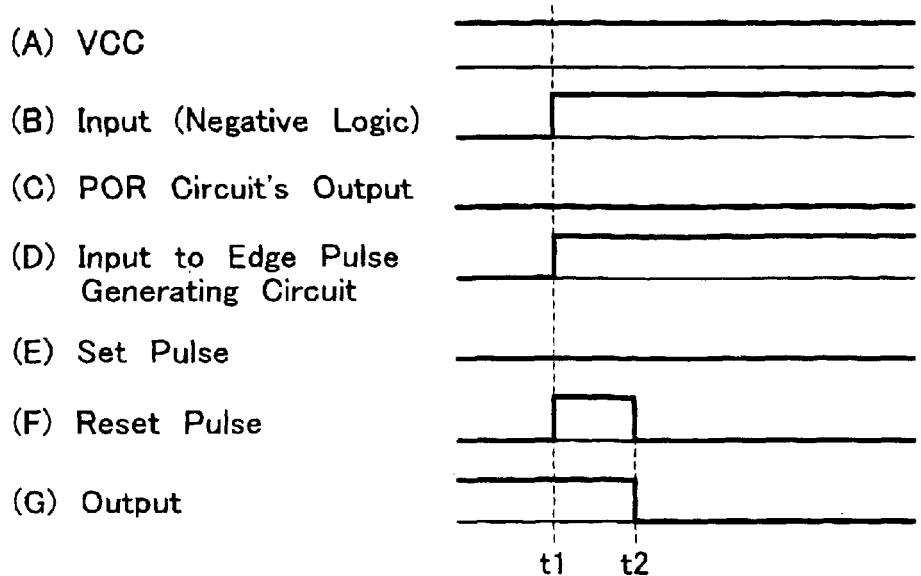
FIGS. 9A–9B are timing charts each showing an operation of the semiconductor circuit 1 shown in FIG. 7 while this circuit operates properly.
Figure 9B:
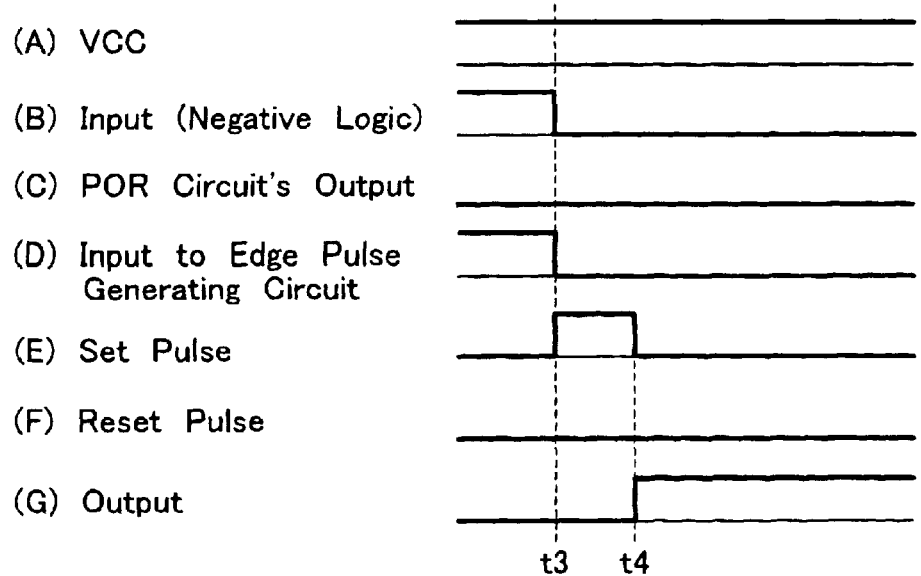

FIG. 1 shows a first embodiment of this invention. A semiconductor circuit in accordance with this embodiment is the one with the edge pulse generation circuit 14 in the prior art high-side driver 10 shown in FIG. 8 being replaced by an edge pulse generation circuit 14' shown in FIG. 1. Note that the remaining parts or components of this embodiment are similar to the prior art so that an explanation thereof will be eliminated herein. Also note that constituent components of the edge pulse generator circuit 14' embodying the invention which are similar to those of the prior art are designated by the same reference characters, and their explanations are omitted here.

The edge pulse generator circuit 14' in accordance with this embodiment includes its reset pulse generation circuit 14A' which is different from that of the prior art (FIG. 8) in that the former is arranged so that a capacitor C1' of the RC delay circuit making up an inverter circuit 53 has a one terminal connected to the power supply voltage Vcc whereas the latter is such that one terminal of the capacitor C1 is coupled to the ground potential GND side.

Figure 7:
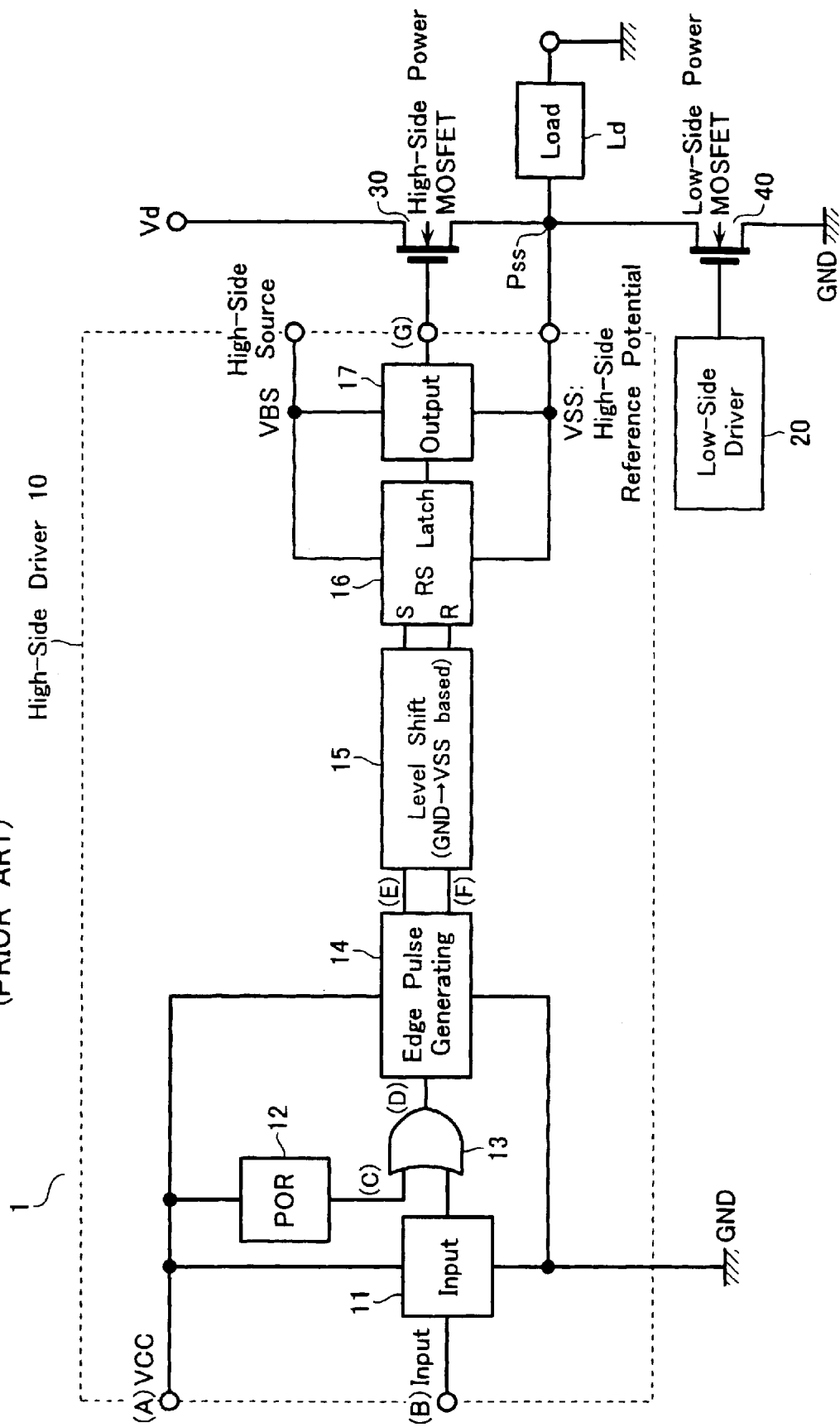
FIG. 7 shows a configuration example of one prior art semiconductor circuit 1.

On the other hand, the edge pulse generator circuit 14' of FIG. 1 includes a set pulse generator circuit 14B which is similar in configuration to that of the prior art of FIG. 7. A capacitor C2 used therein is connected at its one end to the ground potential GND side in a similar way to that of the prior art. Preferably in this set pulse generator circuit 14B, the one terminal of capacitor C2 is coupled to the ground potential GND side as in the prior art, rather than to the power supply voltage Vcc. The reason of this is as follows. When connecting the one terminal of capacitor C2 to ground potential GND, an input signal X being sent to a NOR circuit 59 reliably becomes at "H" level based on the initial state (discharge state) of capacitor C2 even in cases where the output signal D becomes potentially unstable at the time point of potential recovery of the power supply voltage Vcc. This reliable signal X level setup makes it possible to prevent unwanted or accidental output of a set pulse E. If the capacitor C2 is coupled at its one end to the power supply voltage Vcc side, the input signal X can unintentionally be set at "L" level in the same event, resulting in erroneous generation of the set pulse E.

An explanation will next be given of functionality of the semiconductor circuit in accordance with this embodiment. The circuit components other than the set edge pulse generator circuit 14' are similar to those in the prior art so that the functionality of edge pulse generator 14' will mainly be set forth below.

Figure 2A:
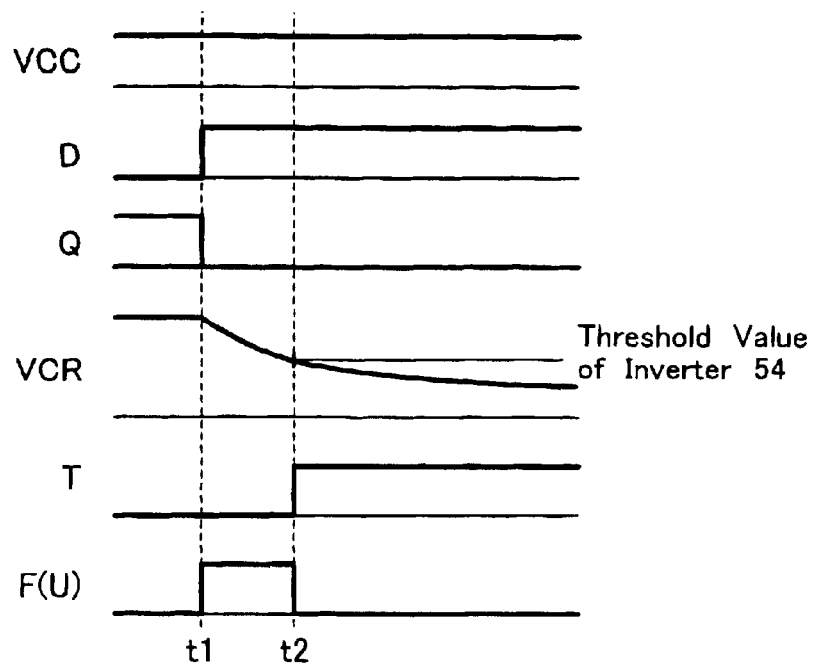
FIGS. 2A and 2B are timing diagrams each showing an operation of a reset pulse generation circuit 14A' of FIG. 1.
Figure 2B:
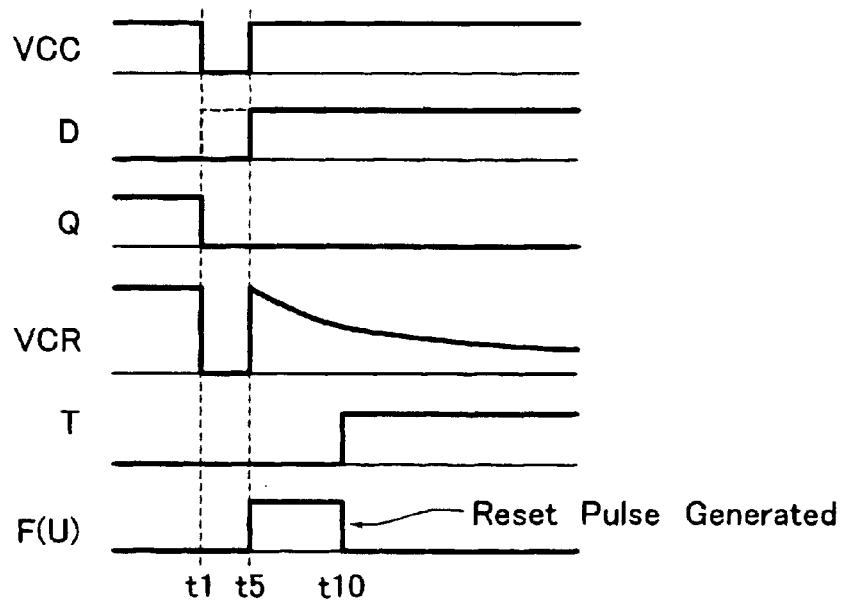

FIGS. 2A and 2B are timing charts each showing an operation of the reset pulse generator circuit 14A. FIG. 2A shows the waveforms of some major signals available when this circuit operates properly (that is, when the power supply voltage Vcc is potentially stable); FIG. 2B shows them in case supply voltage Vcc varies in potential.

As shown in FIG. 2A, in case the power supply voltage Vcc is stabilized in potential, an output signal D of OR gate circuit 13 potentially rises up at time point t1. Simultaneously an output signal Q of inverter circuit 51 falls down. This signal Q is an inverted version of the gate output signal D. At this time a PMOS transistor MP1 in inverter circuit 53 is rendered nonconductive (i.e. turns off), whereas an NMOS transistor MN1 used therein is made conductive (turns on). Whereby, electrical charge is gradually charged to a capacitor C1', causing an output signal VCR to become closer in potential to "L" level along the transition curve as determinable by the time constant of RC delay circuit after time point t1. When at time t2 the output signal VCR becomes less than the threshold voltage of inverter circuit 54, an output signal T of inverter 54 potentially changes from "L" to "H" level. An output signal U, which is indicative of a NOT-OR or "NOR" value of the output signals T and Q, potentially rises up within a time period between time t1 and time t2. This output signal U is for use as the reset pulse F.

Alternatively as shown in FIG. 2B, when the power supply voltage Vcc varies in potential, for example, when at time t1 the output signal D rises from "L" up to "H" level and at the same time the supply voltage Vcc goes low to zero volts upon influence of externally incoming noises or else, the embodiment circuit operates in a way which follows.

Firstly the output signal VCR instantly changes to "L" level at time point t1. This occurs because no charge is at the capacitor C1' at this time t1. However, when supply voltage Vcc potentially recovers at its originally preset or "default" value at time t5, output signal VCR also instantly recovers to "H" level because of the absence of any charge at capacitor C1'. In view of the fact that output signal D stays at "H" at this time t5, the behavior of output signal VCR after time t5 is that it gradually approaches "L" level along the transition curve that is determined by the time constant of an RC delay circuit, which is formed of resistor R1 and capacitor C1'.

The output signal T of inverter circuit 54 potentially falls down to "H" from "L" level at time t10 at which the output signal VCR becomes lower than the threshold value.

Due to this, the output signal U of NOR gate circuit 55 becomes a pulse signal which potentially rises up at time t5 and then falls down at time t10. This signal is output as the reset pulse F.

Figure 3A:
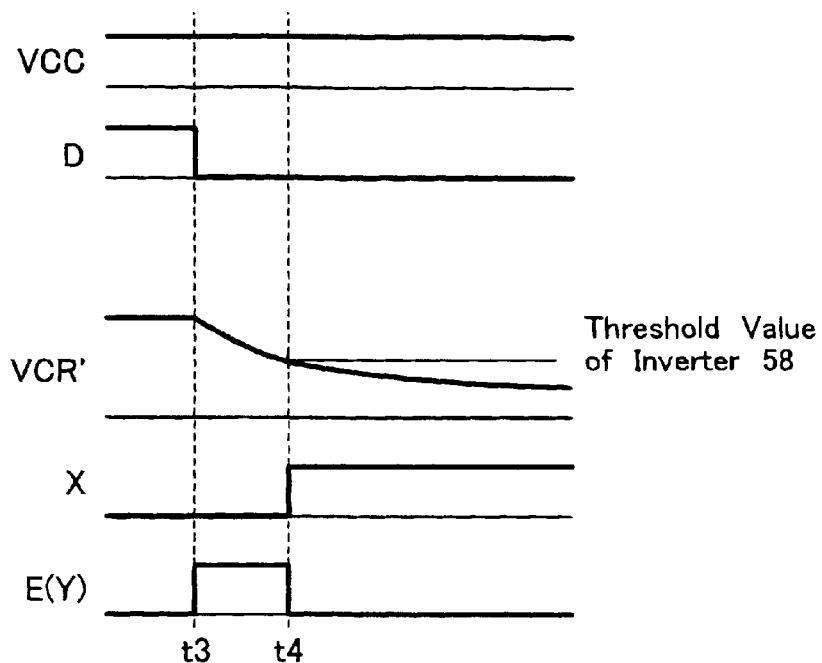
FIGS. 3A–3B are timing charts each showing an exemplary operation of a set pulse generation circuit 14B of FIG. 1.
Figure 3B:
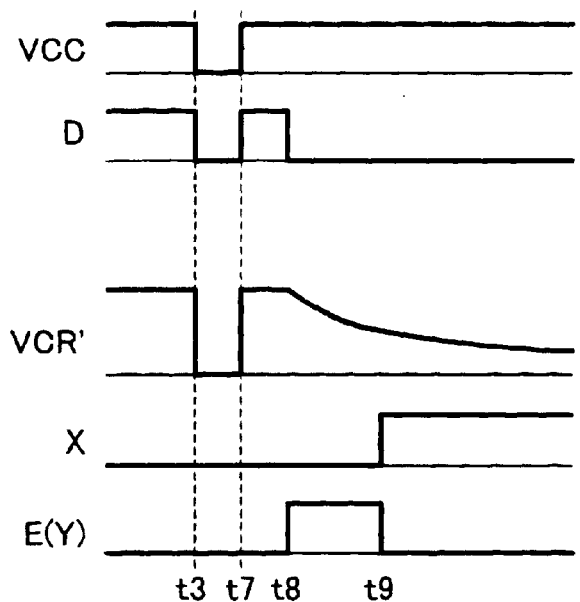
Figure 10A:
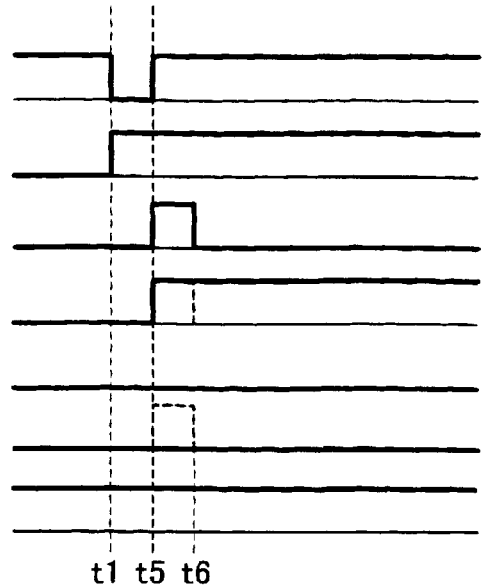
FIGS. 10A–10B are timing charts each showing an operation of the semiconductor circuit 1 in case its power supply voltage Vcc is potentially varied.
Figure 10B:
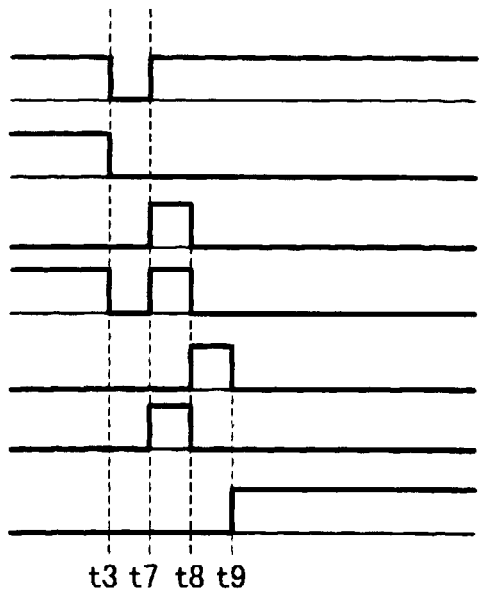
Figure 11A:
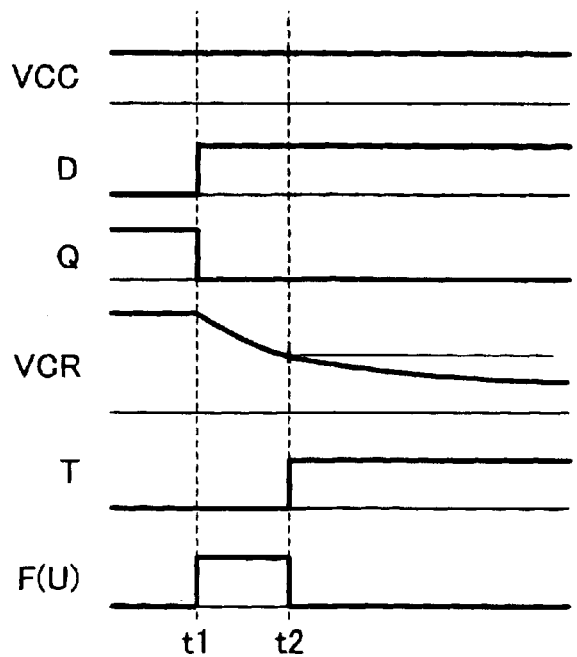
FIGS. 11A–11B are timing charts each showing an operation of a reset pulse generation circuit 14A shown in FIG. 8.
Figure 11B:
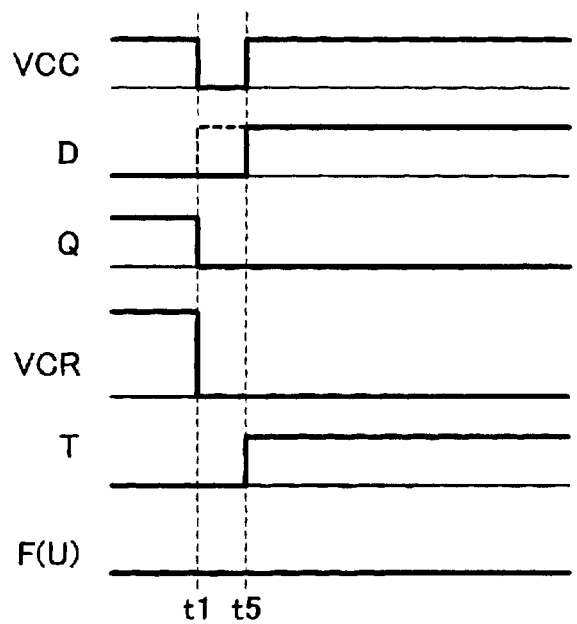
Figure 12A:
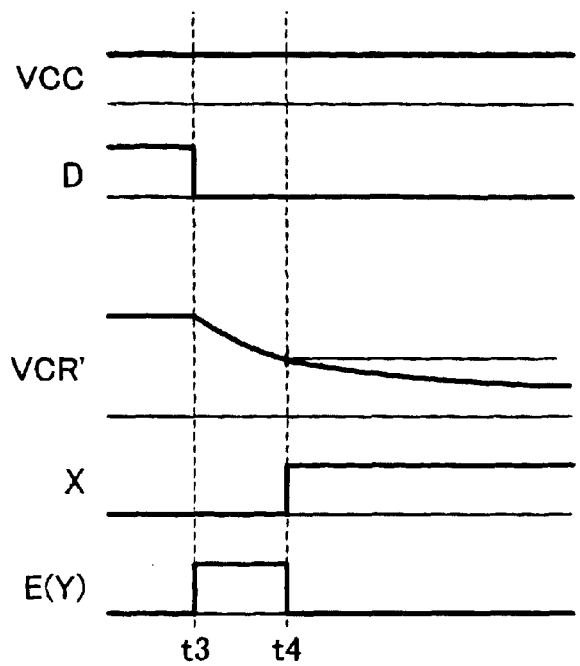
FIGS. 12A–12B are timing charts each showing an operation of a set pulse generation circuit 14B shown in FIG. 8.
Figure 12B:
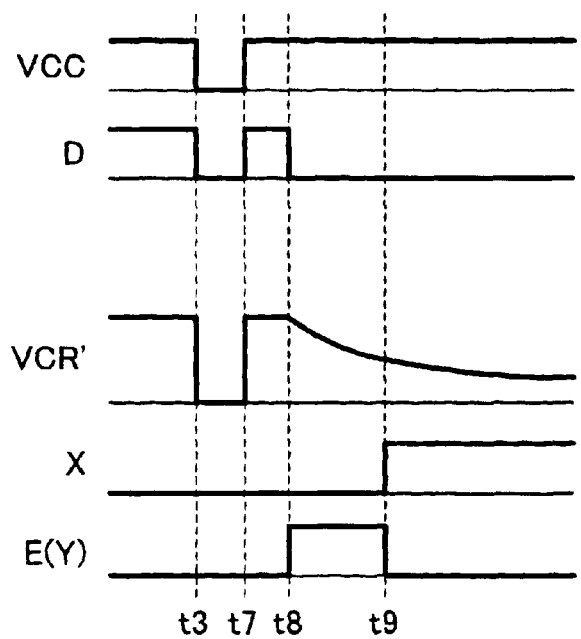

It must be noted that the set pulse generator circuit 14B is the same in configuration as that of the prior art shown in FIG. 10 so that its functionality and operability are the same as those of the prior art (FIGS. 12A and 12B) as shown in FIGS. 3A and 3B.

In this way, according to this embodiment, it is possible to generate and issue the reset pulse F by the reset pulse generator circuit 14A even upon occurrence of potential variation or fluctuation of the power supply voltage Vcc. This in turn makes it possible to achieve enhanced stability in operation of the high-side driver 10.

[Second Embodiment]

Figure 4:
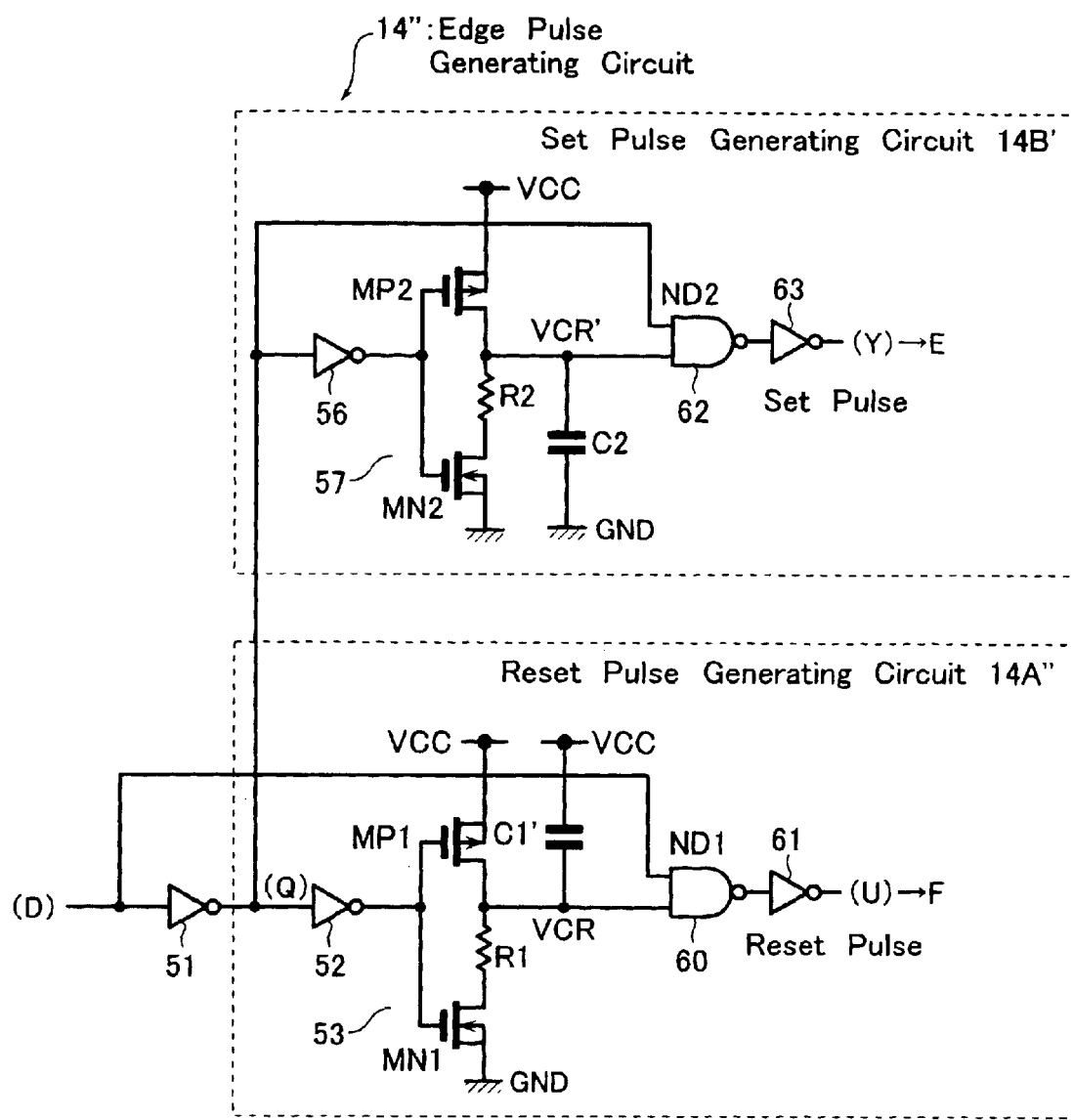
FIG. 4 is a circuit diagram showing a configuration of a semiconductor circuit in accordance with a second embodiment of this invention.
Figure 5A:
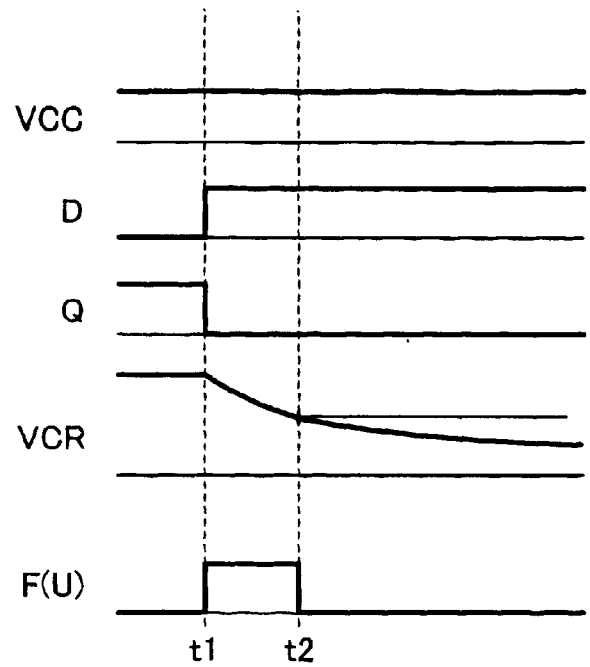
FIGS. 5A–5B are timing charts each showing an operation of a reset pulse generation circuit 14A" of FIG. 4.
Figure 5B:
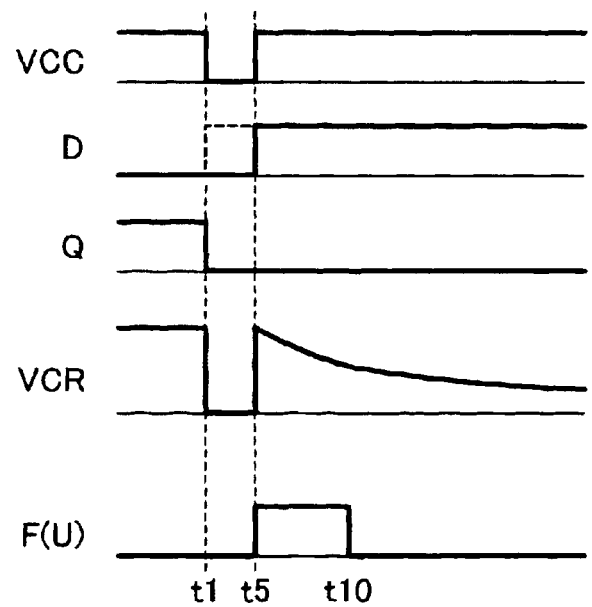
Figure 6A:
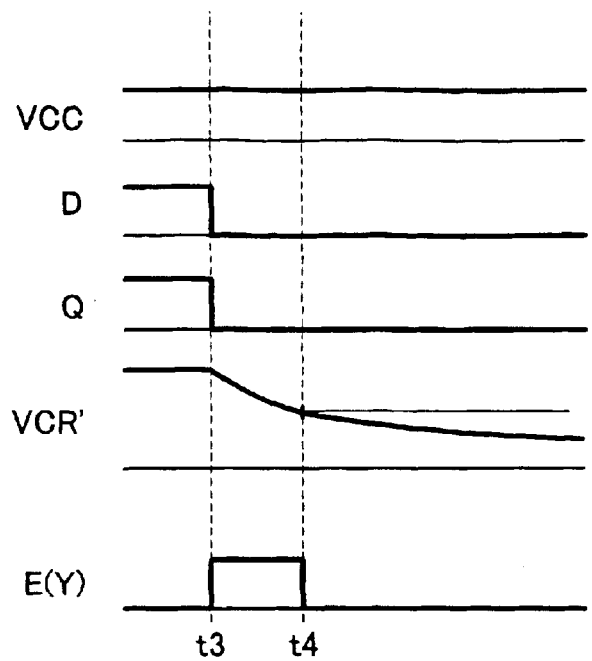
FIGS. 6A–6B are timing charts each showing an operation of a set pulse generation circuit 14B' of FIG. 4.
Figure 6B:
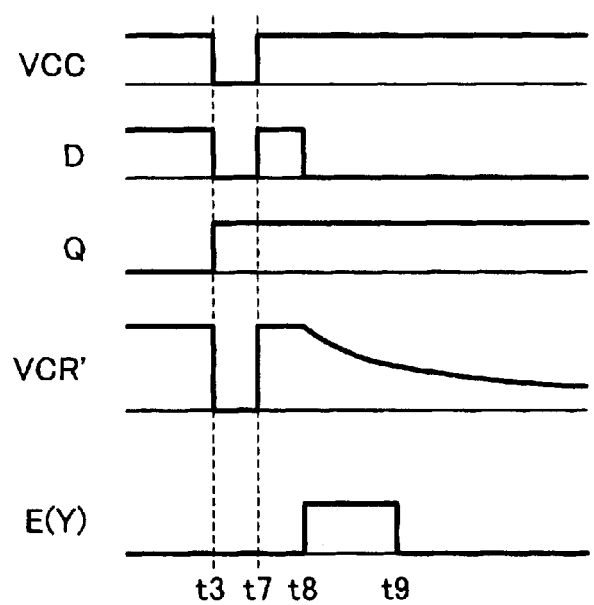

FIG. 4 is a circuit diagram showing a second embodiment of the invention. An edge pulse generator circuit 14N of this embodiment is generally configured from a reset pulse generator circuit 14A" and a set pulse generator circuit 14B'.

The reset pulse generator circuit 14A" is similar to the edge pulse generator circuit 14' of the first embodiment with the inverter circuit 54 and NOR gate circuit 55 being replaced by a NAND gate circuit 60 and an inverter circuit 61.

Additionally the set pulse generator circuit 14B' is similar to the set pulse generator circuit 14B of the first embodiment with the inverter circuit 58 and NOR gate circuit 59 being replaced with a NAND gate circuit 62 and inverter circuit 63. The NAND gate 60 receives at its inputs an output signal D and an output signal VCR from inverter circuit 53, while the NAND gate 62 receives an inverted signal Q of the output signal D as generated by inverter 51 along with an output signal VCR' from inverter 53. Whereby, it is possible to output the output signals U and Y during proper operations and also output them even upon occurrence of potential variation of the power supply voltage Vcc in a similar way to that of the first embodiment (refer to FIGS. 5A–5B and 6A–6B).

While the specific embodiments of the invention have been set forth, the present invention should not exclusively be limited thereto and may be modified and altered in circuit design with addition of circuit parts or components in a variety of ways without departing from the true spirit and scope of the invention. For example, although in the above embodiments one specific case in which the power supply voltage Vcc potentially varies at the same time that the output signal D changes has been explained for purposes of simplification in explanation, this invention should not be limited to such power supply voltage Vcc variation occurring simultaneously upon potential change of the input signal and may support any possible power supply voltage Vcc variations occurring at any time points. Also note that although in the above embodiments the specific example is shown which drives half bridge-coupled inverter circuitry, the invention should not be limited thereto and may also be applicable to the cases for driving full bridge circuitry having high-side and low-side switching elements and/or three-phase inverter circuitry. Regarding the logic circuits also, these are not limited to the ones shown in FIGS. 1 and 4. A variety of types of logic circuits may be employable.

Optionally, it is also possible to modify the embodiment circuitry so that the high-side driver 10 and low-side driver 20 are integrated together onto a single integrated circuit (IC) chip to thereby enable further improvement in reliability while at the same time reducing in number the parts or components of the entire circuitry. Moreover, the high-side power MOS transistor 30 and low-side power MOS transistor 40 in addition to the high-side/low-side drivers 10 and 20 may be integrated together onto a single IC chip. Using this approach makes it possible to further improve the reliability and further reduce the circuit elements in total number.

As apparent from the foregoing description, according to the semiconductor circuit device in accordance with the present invention, it is possible to provide improved pulse generation circuitry capable of reliable pulse generation even upon potential variation or fluctuation of the power supply voltage while at the same time avoiding or at least greatly suppressing operation failures or malfunction, along with high-side driver circuitry using the same.

What is claimed is:

1. A pulse generating circuit comprising:
a reset pulse generation circuit configured to output a reset pulse based on changes of an input signal from a first state to a second state;
a set pulse generation circuit configured to output a set pulse based on changes of said input signal from said second state to said first state;
said reset pulse generation circuit comprising:
a first inverter circuit including a pair of transistors as complementarily connected between a power supply line and a ground line; and
a first delay unit including a first capacitor connected between an output end of said first inverter circuit and said power supply line, and configured to output a delayed output signal with a delayed state change of said input signal,
said set pulse generation circuit comprising:
a second inverter circuit including a pair of transistors as complementarily connected between a power supply line and a ground line; and
a second delay unit including a second capacitor connected between an output end of said second inverter circuit and said ground line and configured to output a delayed output signal with a delayed state change of said input signal,
said first inverter circuit being operable to output a signal at a level of said power supply line when said input signal is in the first state and to output a signal at a level of said ground line when said input signal is in the second state.

2. The pulse generating circuit according to claim 1, further comprising an inversion circuit configured to invert said input signal, and wherein
said input signal is input to one of said reset pulse generation circuit and said set pulse generation circuit whereas an output of said inversion circuit is input to a remaining one thereof.

3. The pulse generating circuit according to claim 1, wherein each of said first and second inverter circuits is formed of a P-channel metal oxide semiconductor ("PMOS") transistor with a source connected to said power supply line and an N-channel metal oxide semiconductor ("NMOS") transistor with a source coupled to the ground line and also with a gate connected to a gate of said PMQS transistor, and wherein said first and second delay units each further comprises a resistor connected between a drain of said NMOS transistor and said output end of said inverter circuits.

4. The pulse generating circuit according to claim 1, wherein said first and second capacitors are MOS capacitors.

5. The pulse generating circuit according to claim 1, wherein said reset pulse generating circuit further comprises a logical processing circuit logically processing said input signal and said delayed output signal to generate and output said reset pulse.

6. The pulse generating circuit according to claim 1, wherein said set pulse generating circuit further comprises a logical processing circuit logically processing said input signal and said delayed output signal to generate and output said set pulse.

7. A high-side driver circuit configured for use with a power device having bridge circuitry of a high-side power transistor and a low-side power transistor driving said high-side power transistor of the power device, said high-side driver circuit comprising:
- a pulse generating circuit having a reset pulse generation circuit configured to output a reset pulse when an input signal changes from a first state to a second state and a set pulse generation circuit configured to output a set pulse when said input signal changes from said second state to said first state;
- a power-on reset circuit outputting upon power recovery a power-on reset signal as an input signal of said pulse generating circuit;
- a level shift circuit shifting levels of the reset pulse and set pulse as output from said pulse generation circuit;
- a latch circuit with an output state being reset and set by the level-shifted reset pulse and set pulse respectively;
- an output circuit operatively responsive to an output of said latch circuit outputting a drive signal used to drive said high-side power transistor;
- said reset pulse generation circuit comprising:
- a first inverter circuit including a pair of transistors as complementarily connected between a power supply line and a ground line; and
- a first delay unit including a first capacitor connected between an output end of said first inverter circuit and said power supply line, and configured to output a delayed output signal with a delayed state change of said input signal,
- said set pulse generation circuit comprising:
- a second inverter circuit including a pair of transistors as complementarily connected between a power supply line and a ground line; and
- a second delay unit including a second capacitor connected between an output end of said second inverter circuit and said ground line, and configured to output a delayed output signal with a delayed state change of said input signal,
- said first inverter circuit being operable to output a signal at a level of said power supply line when said input signal is in the first state and to output a signal at a level of said ground line when said input signal is in the second state,
- said second inverter circuit being operable to output a signal at the level of said power supply line when said input signal is in the second state and to output a signal at the level of said ground line when said input signal is in the first state while outputting a signal at the level of said power supply line during output of said power-on reset signal.

8. The high-side driver circuit according to claim 7, further comprising an inversion circuit inverting said input signal, and wherein
said input signal is input to one of said reset pulse generation circuit and said set pulse generation circuit whereas an output of said inversion circuit is input to a remaining one thereof.

9. The high-side driver circuit according to claim 7, wherein each of said first and second inverter circuits is formed of a P-channel metal oxide semiconductor ("PMOS") transistor with a source connected to said power supply line and an N-channel metal oxide semiconductor ("NMOS") transistor with a source coupled to the ground line and also with a gate connected to a gate of said PMOS transistor, and wherein said first and second delay units each further comprises a resistor connected between a drain of said NMOS transistor and said output end of said inverter circuits.

10. The high-side driver circuit according to claim 7, wherein said first and second capacitors are MOS capacitors.

11. The high-side driver circuit according to claim 7, wherein said reset pulse generating circuit further comprises a logical processing circuit logically processing said input signal and said delayed output signal to generate and output said reset pulse.

12. The high-side driver circuit according to claim 7, wherein said set pulse generating circuit further comprises a logical processing circuit logically processing said input signal and said delayed output signal to generate and output said set pulse.

13. A gate driver circuit comprising a high-side driver circuit and a low-side driver circuit, configured for use with a power device having bridge circuitry of a high-side power transistor and a low-side power transistor, said high-side driver circuit comprising:
- a pulse generating circuit having a reset pulse generation circuit configured to output a reset pulse when an input signal changes from a first state to a second state and a set pulse generation circuit configured to output a set pulse when said input signal changes from said second state to said first state;
- a power-on reset circuit outputting upon power recovery a power-on reset signal as an input signal of said pulse generating circuit;
- a level shift circuit shifting levels of the reset pulse and set pulse as output from said pulse generation circuit;
- a latch circuit with an output state being reset and set by the level-shifted reset pulse and set pulse respectively;
- an output circuit operatively responsive to an output of said latch circuit outputting a drive signal used to drive said high-side power transistor;
- said reset pulse generation circuit comprising:
- a first inverter circuit including a pair of transistors as complementarily connected between a power supply line and a ground line; and
- a first delay unlit including a first capacitor connected between an output end of said first inverter circuit and said power supply line, and configured to output a delayed output signal with a delayed state change of said input signal,
- said set pulse generation circuit comprising:
- a second inverter circuit including a pair of transistors as complementarily connected between a power supply line and a ground line; and
- a second delay unit including a second capacitor connected between an output end of said second inverter circuit and said ground line, and configured to output a delayed output signal with a delayed state change of said input signal,
- said first inverter circuit being operable to output a signal at a level of said power supply line when said input signal is in the first state and to output a signal at a level of said ground line when said input signal is in the second state,
- said second inverter circuit being operable to output a signal at the level of said power supply line when said input signal is in the second state and to output a signal at the level of said ground line when said input signal is in the first state while outputting a signal at the level of said power supply line during output of said power-on reset signal.

14. The gate driver circuit according to claim 13, said high-side driver circuit further comprising an inversion circuit inverting said input signal, and wherein said input signal is input to one of said reset pulse generation circuit and said set pulse generation circuit whereas an output of said inversion circuit is input to a remaining one thereof.

15. The gate driver circuit according to claim 13, wherein each of said first and second inverter circuits is formed of a P-channel metal oxide semiconductor ("PMOS") transistor with a source connected to said power supply line and an N-channel metal oxide semiconductor ("NMOS") transistor with a source coupled to the ground line and also with a gate connected to a gate of said PMOS transistor, and wherein said first and second delay units further comprise a resistor connected between a drain of said NMOS transistor and said output end of said inverter circuits.

16. The gate driver circuit according to claim 13, wherein said first and second capacitors are MOS capacitors.

17. The gate driver circuit according to claim 13, wherein said reset pulse generating circuit further comprises a logical processing circuit logically processing said input signal and said delayed output signal to generate and output said reset pulse.

18. The gate driver circuit according to claim 13, wherein said set pulse generating circuit further comprises a logical processing circuit logically processing said input signal and said delayed output signal to generate and output said set pulse.

19. The gate driver circuit according to claim 13, wherein said high-side driver circuit and said low-side driver circuit are integrated together onto a single integrated circuit chip.

* * * * *